(12) United States Patent
Bedell et al.

(10) Patent No.: US 10,644,184 B2
(45) Date of Patent: May 5, 2020

(54) TYPE IV SEMICONDUCTOR BASED HIGH VOLTAGE LATERALLY STACKED MULTIJUNCTION PHOTOVOLTAIC CELL

(71) Applicant: INTERNATIONAL BUSINESS MACHINES CORPORATION, Armonk, NY (US)

(72) Inventors: Stephen W. Bedell, Wappingers Falls, NY (US); Ning Li, White Plains, NY (US); Devendra K. Sadana, Pleasantville, NY (US); Ghavam G. Shahidi, Pound Ridge, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/875,535

(22) Filed: Jan. 19, 2018

(65) Prior Publication Data
US 2018/0145202 A1  May 24, 2018

Related U.S. Application Data

(62) Division of application No. 15/285,913, filed on Oct. 5, 2016, now Pat. No. 9,935,230.

(51) Int. Cl.
*H01L 31/076* (2012.01)
*H01L 31/028* (2006.01)
(Continued)

(52) U.S. Cl.
CPC .......... *H01L 31/076* (2013.01); *H01L 31/028* (2013.01); *H01L 31/022433* (2013.01); *H01L 31/03529* (2013.01); *H01L 31/0687* (2013.01); *H01L 31/1804* (2013.01); *Y02E 10/544* (2013.01); *Y02E 10/547* (2013.01); *Y02P 70/521* (2015.11)

(58) Field of Classification Search
None
See application file for complete search history.

(56) References Cited

U.S. PATENT DOCUMENTS

| 7,442,320 B2 | 10/2008 | Lee |
| 9,373,743 B2 | 6/2016 | Hekmatshoar-Tabari et al. |

(Continued)

OTHER PUBLICATIONS

List of IBM Patents or Patent Applications Treated as Related dated Jan. 19, 2018, 2 pages.

*Primary Examiner* — Eli S Mekhlin
(74) *Attorney, Agent, or Firm* — Tutunjian & Bitetto, P.C.; Erik Johnson

(57) ABSTRACT

A method of forming a photovoltaic device that includes ion implanting a first conductivity type dopant into first regions of a semiconductor layer of an SOI substrate, wherein the first regions are separated by a first pitch; and ion implanting a second conductivity type dopant into second regions of the semiconductor layer of the SOI substrate. The second regions are separated by a second pitch. Each second conductivity type implanted region of the second regions is in direct contact with first conductivity type implanted region of the first regions to provide a plurality of p-n junctions, and adjacent p-n junctions are separated by an intrinsic portion of the semiconductor layer to provide P-I-N cells that are horizontally oriented.

20 Claims, 9 Drawing Sheets

(51) Int. Cl.
*H01L 31/18* (2006.01)
*H01L 31/0224* (2006.01)
*H01L 31/0352* (2006.01)
*H01L 31/0687* (2012.01)

(56) References Cited

U.S. PATENT DOCUMENTS

| | | |
|---|---|---|
| 9,520,513 B2 | 12/2016 | Eaglesham |
| 2007/0277874 A1* | 12/2007 | Dawson-Elli ....... H01L 31/0687 136/256 |
| 2012/0049242 A1* | 3/2012 | Atanackovic ... H01L 31/022441 257/184 |
| 2012/0292675 A1* | 11/2012 | Roizin ................ H01L 27/1421 257/290 |

* cited by examiner

TYPE IV SEMICONDUCTOR BASED HIGH VOLTAGE LATERALLY STACKED MULTIJUNCTION PHOTOVOLTAIC CELL

BACKGROUND

Technical Field

The present disclosure relates to photovoltaic devices, and more particularly to photovoltaic devices including type IV semiconductor materials.

Description of the Related Art

A photovoltaic device is a device that converts the energy of incident photons to electromotive force (e.m.f.). Typical photovoltaic devices include solar cells, which are configured to convert the energy in the electromagnetic radiation from the sun to electric energy. Multi-junction solar cells comprising compound semiconductors may be employed for power generation in space due to their high efficiency and radiation stability.

SUMMARY

In one embodiment, a method of forming a photovoltaic device is described that includes providing a semiconductor on insulator (SOI) substrate; ion implanting a first conductivity type dopant into first regions of the semiconductor layer of the SOI substrate, wherein the first regions are separated by a first pitch; and ion implanting a second conductivity type dopant into second regions of the semiconductor layer of the SOI substrate, wherein the second regions are separated by a second pitch. Each second conductivity type implanted region of the second regions is in direct contact with first conductivity type implanted region of the first regions to provide a plurality of p-n junctions. Adjacent p-n junctions are separated by an intrinsic portion of the semiconductor layer to provide P-I-N cells that are horizontally oriented.

In another embodiment, a method of forming a photovoltaic device is provided that includes providing a semiconductor on insulator (SOI) substrate; and etching a plurality of openings through a semiconductor layer of the SOI substrate to a buried oxide layer of the SOI substrate. The method may continue with forming a first conductivity type doped semiconductor material on sidewalls of the semiconductor layer exposed by the plurality of openings. Thereafter, a second conductivity type doped semiconductor material is formed on sidewalls of the first conductivity type doped semiconductor material to provide p-n junctions; and intrinsic semiconductor material is formed filling a remainder of the plurality of openings. The adjacent p-n junctions are separated by the intrinsic semiconductor material to provide P-I-N cells that are horizontally oriented.

In another aspect of the present disclosure, a photovoltaic device is provided that includes a semiconductor on insulator (SOI) substrate; n-type doped regions extending from an upper surface of the semiconductor layer of the SOI substrate to a buried oxide layer of the SOI substrate in a first plurality of regions in the SOI substrate; and p-type doped regions extending from the upper surface of the semiconductor layer of the SOI layer to a buried oxide layer on the SOI substrate in a second plurality of regions in the SOI substrate. One of each of the first and second plurality of n-type and p-type regions are adjacent to one another to provide a plurality of P-N junctions. An intrinsic semiconductor material is present between the first and second plurality of regions in the SOI substrate separating adjacent P-N junctions to provide P-I-N cells that are horizontally oriented.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Figure 1:
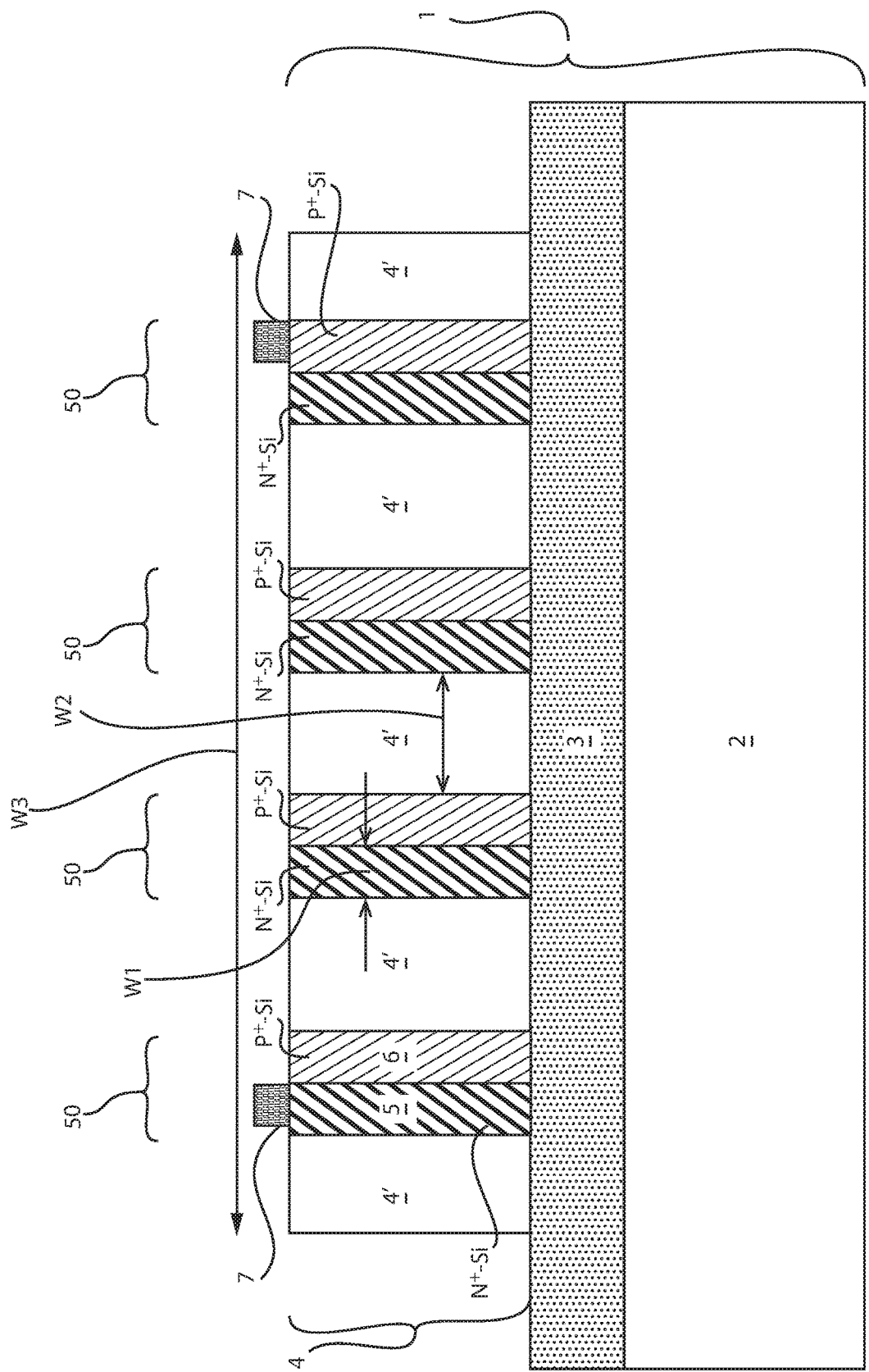
FIG. 1 is a side cross-sectional view depicting one embodiment of a type IV semiconductor based laterally stacked multi-junction photovoltaic cell, in accordance with one embodiment of the present disclosure.

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", and derivatives thereof shall relate to the invention, as it is oriented in the drawing figures. The terms "overlying", "atop", "positioned on" or "positioned atop" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

In one embodiment, the present disclosure provides a horizontally orientated multi-junction photovoltaic device, such as a solar cell, and a method of forming the same. As used herein, a "photovoltaic device" is a device, such as a solar cell, that produces free electrons and/or vacancies, i.e., holes, when exposed to radiation, such as light, and results in the production of an electric current. A multi-junction photovoltaic device typically includes a multiple junctions of a semiconductor layer of a p-type conductivity that shares an interface with a semiconductor layer of an n-type conductivity, in which the interface provides an electrical junction.

Physically small, i.e., devices having a small footprint, having high voltage requirements are needed. In some embodiments, the voltage requirements can be met by a multi-junction photovoltaic cells, as depicted in FIG. 1. The voltage requirements for a photovoltaic device of this type may require between 2 volts and 3 volts to drive light emitting diodes (LEDs) for communication applications. The voltage requirements to write and read memory cells may range from 2 volts to 3.5 volts. In battery applications, the photovoltaic devices may need to provide 3.5 volts to charge a battery.

The photovoltaic device 100 depicted in FIG. 1 may be composed of a type IV semiconductor, in which the junctions that provide the p-n junctions 50 of the photovoltaic cell are provided by ion implantation. The photovoltaic device 100 may be formed in the semiconductor layer 4 of a semiconductor on insulator (SOI) substrate 1, in the semiconductor layer 4 is directly atop a dielectric layer 3. A base semiconductor substrate 2 may be present underlying the dielectric layer 3, in which the base semiconductor substrate 2 is composed of a semiconductor material that is the same as or different from the type IV semiconductor material that provides the semiconductor layer 4.

By "type IV semiconductor" it is meant that the semiconductor material includes at least one element from Group IVA (i.e., Group 14) of the Periodic Table of Elements. Examples of type IV semiconductor materials that are suitable for the fin structure include silicon (Si), germanium (Ge), silicon germanium (SiGe), silicon doped with carbon (Si:C), silicon germanium doped with carbon (SiGe:C) and a combination thereof.

The p-n junctions 50 formed in the type IV semiconductor substrate are provided by ion implanting p-type or n-type dopants into specified and separate portions of the substrate using ion implantation and masking methods. As used herein, "p-type" refers to the addition of impurities to an intrinsic semiconductor that creates deficiencies of valence electrons. In a silicon-containing substrate, examples of n-type dopants, i.e., impurities, include but are not limited to: boron, aluminum, gallium and indium. As used herein, "n-type" refers to the addition of impurities that contributes free electrons to an intrinsic semiconductor. In a silicon containing substrate, examples of n-type dopants, i.e., impurities, include but are not limited to antimony, arsenic and phosphorous.

The opposing conductivity type regions are formed abutting one another to provide a junction, i.e., p-n junction 50. For example, a first conductivity type dopant region 5, e.g., n-type dopant region (hereafter referred to as an n-type conductivity dopant region 5), may be ion implanted into a first region of the semiconductor layer 4, and a second conductivity type dopant region 6, e.g., p-type dopant region (hereafter referred to as a p-type conductivity dopant region 6) is formed in a second region of the semiconductor layer 4 also using ion implantation, in which the first and second regions of the semiconductor layer 4 are abutting one another.

The dopant that provides the conductivity type for the n-type and p-type dopants for doping the first and second conductivity regions 5, 6 are implanted so that the dopant regions extend to a depth that contacts the buried dielectric layer 3. The n-type and p-type dopants are doped to extend from the upper surface of the semiconductor layer 4 to the base surface of the semiconductor layer 4 that interfaces with the buried dielectric layer 3.

In one embodiment, the p-type dopant that provides the p-type conductivity dopant region 6 is present in a concentration ranging from $1 \times 10^9$ atoms/cm$^3$ to $1 \times 10^{20}$ atoms/cm$^3$. In another embodiment, the p-type dopant that provides the p-type conductivity dopant region 6 is present in a concentration ranging from $1 \times 10^{14}$ atoms/cm$^3$ to $1 \times 10^{18}$ atoms/cm$^3$.

In one embodiment, the n-type dopant that provides the n-type conductivity dopant region 5 is present in a concentration ranging from $1 \times 10^9$ atoms/cm3 to $1 \times 10^{20}$ atoms/cm$^3$. In another embodiment, in which the first conductivity type is n-type, the n-type dopant is present in a concentration ranging from $1 \times 10^{14}$ atoms/cm$^3$ to $1 \times 10^{18}$ atoms/cm$^3$.

The width W1 of each of the n-type dopant conductivity region 4, and the p-type dopant conductivity region 5 may range from 100 nm to 5 micron. In another example, the width W1 of each of the n-type and p-type dopant conductivity regions 5 may range from 500 nm to 1 micron.

Still referring to FIG. 1, the portion of the semiconductor layer 4' that is not implanted with an n-type or p-type dopant that separates adjacent p-n junctions 50 from one another may be referred to an intrinsic semiconductor layer 4'. An "intrinsic semiconductor", also called an undoped semiconductor or i-type semiconductor, is a pure semiconductor without any significant dopant species present. The number of charge carriers is therefore determined by the properties of the material itself instead of the amount of impurities. For example, in intrinsic semiconductors the number of excited electrons and the number of holes are equal: n=p. The width W2 of each of the intrinsic semiconductor layer 4' separating the n-type and p-type conductivity doped regions 5, 6 may range from 1 micron to 100 micron. In another embodiment, the width W2 of the intrinsic semiconductor material may range from 5 microns to 25 microns.

The orientation of the sequence of the n-type doped conductivity region 5, the p-type doped conductivity region 6 and the instinsic semiconductor layer 4' is horizontally orientated. This means that the direction D1 in which the material stack changes from n-type doped conductivity regions 5, p-type doped conductivity region 6 and intrinsic semiconductor layer 4' is parrallel with the plane defined by the upper surface of the dielectric layer 3, as depicted in FIG. 1

Although FIG. 1 depicts a structure including four p-n junctions 50, the present disclosure is not limited to only this embodiment. For example, the number of p-n junctions may be equal to 2, 5, 10, 15 and 20 etc. The number of p-n junctions may also be any number within a range having a lower limit and an upper limit equal to one of the aforementioned values.

The semiconductor layer 4 including the p-n junctions 50 and the intrinsic semiconductor layer 4' is patterned to provide a width W3 ranging from 10 microns to 100 microns. In some embodiments, the semiconductor layer 4 including the intrinsic semiconductor layer 4' is patterned to provide a width W3 ranging from 50 microns to 150 microns. In one example, the width W3 is equal to 100 microns.

The semiconductor layer 4 including the p-n junctions 50 and the intrinsic semiconductor layer 4' may have a length dimension, i.e., the dimension traveling into and out of the page perpendicular to the width dimension W3, ranging from 10 microns to 100 microns. In another embodiment, the length dimension may range from 50 microns to 150 microns. In one example, the length dimension for the semiconductor layer 4 including the p-n junctions 50 and the intrinsic semiconductor layer 4' is equal to 100 microns. The geometry defined by the width W3 and length dimensions for the semiconductor layer 4 including the p-n junctions 50 may be square, but in some embodiments can be rectangular or have other multi-sided geometries.

The photovoltaic device 100 may also include metal containing electrodes 7. One of the metal containing electrodes 7 may be in direct contact with a n-type conductivity doped region 5 and an opposing second metal containing electrode 7 may be in direct contact with a p-type conductivity doped region 6. The metal containing electrodes 7 may be composed of copper, aluminum, tungsten, gold, silver and combinations thereof.

Figure 2:
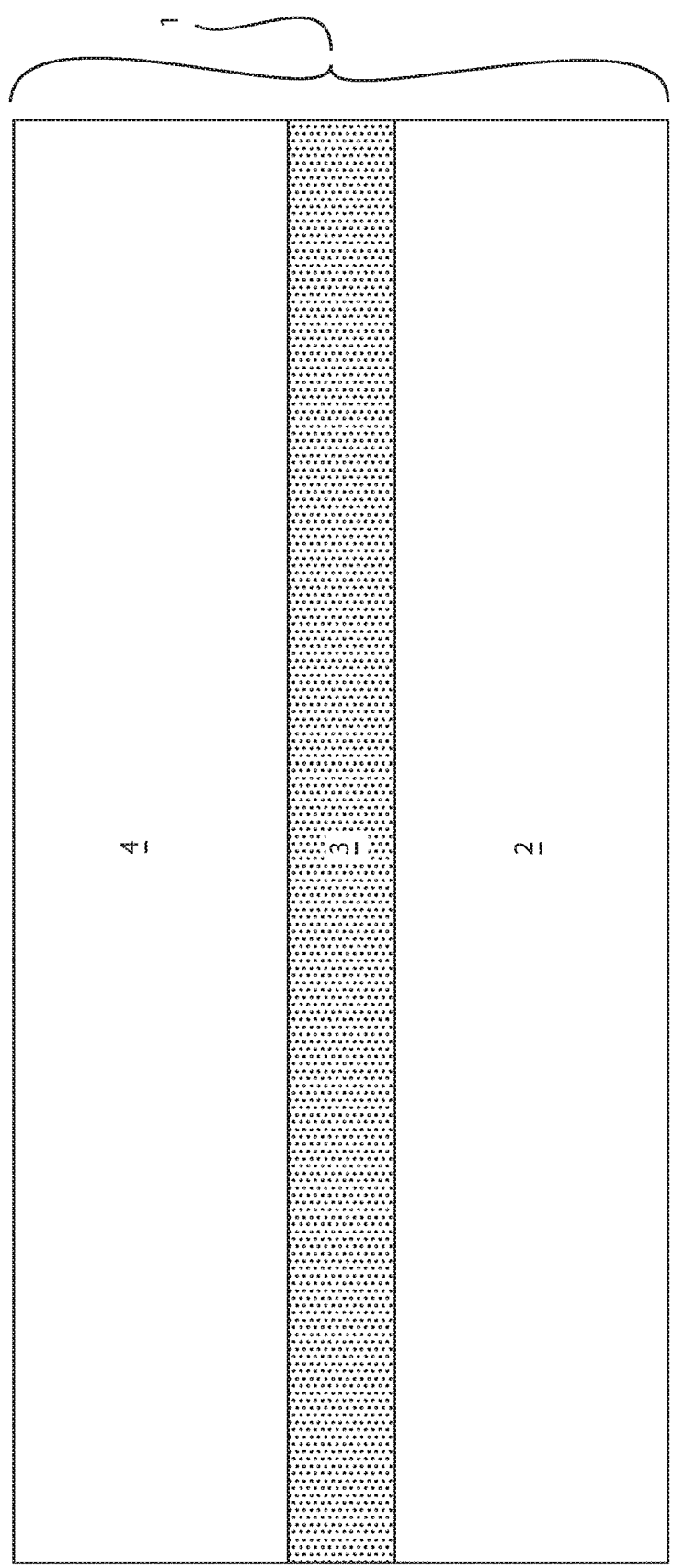
FIG. 2 is a side cross-sectional view of a semiconductor on insulator (SOI) substrate, as used in one embodiment of the present disclosure.

One embodiment of a method for forming the photovoltaic device depicted in FIG. 1 is now described with reference to FIGS. 2-4. FIG. 2 depicts one embodiment of a semiconductor on insulator (SOI) substrate 1. The SOI substrate 1 may include at least one SOI layer 4, i.e., semiconductor on insulator (SOI) layer 4 (also referred to as semiconductor layer 4), overlying a buried dielectric layer 3, wherein the SOI layer 4 has a thickness of ~0.5 μm to ~2 μm. A base semiconductor layer 2 may be present underlying the buried dielectric layer 3. The SOI layer 4 and the base semiconductor layer 2 may be composed of the same or a different semiconductor material. The semiconductor material that provides the SOI layer 4 may be any semiconducting material including, but not limited to Si, SiC, SiGe, SiGeC, Si alloys, Ge, Ge alloys, GaAs, InAs, and InP, or any combination thereof. In one embodiment, the semiconductor material that provides the SOI layer 4 is silicon (Si). The base semiconductor layer 2 may be a semiconducting material including, but not limited to Si, strained Si, SiC, SiGe, SiGeC, Si alloys, Ge, Ge alloys, GaAs, InAs, InP as well as other III/V and II/VI compound semiconductors.

The buried dielectric layer 3 that may be present underlying the SOI layer 4 and atop the base semiconductor layer 2 may be formed by implanting a high-energy dopant into a bulk semiconductor substrate and then annealing the structure to form a buried dielectric layer 3. In another embodiment, the buried dielectric layer 3 may be deposited or grown prior to the formation of the SOI layer 4. In yet another embodiment, the SOI substrate 1 may be formed using wafer-bonding techniques, where a bonded wafer pair is formed utilizing glue, adhesive polymer, or direct bonding.

Figure 3:
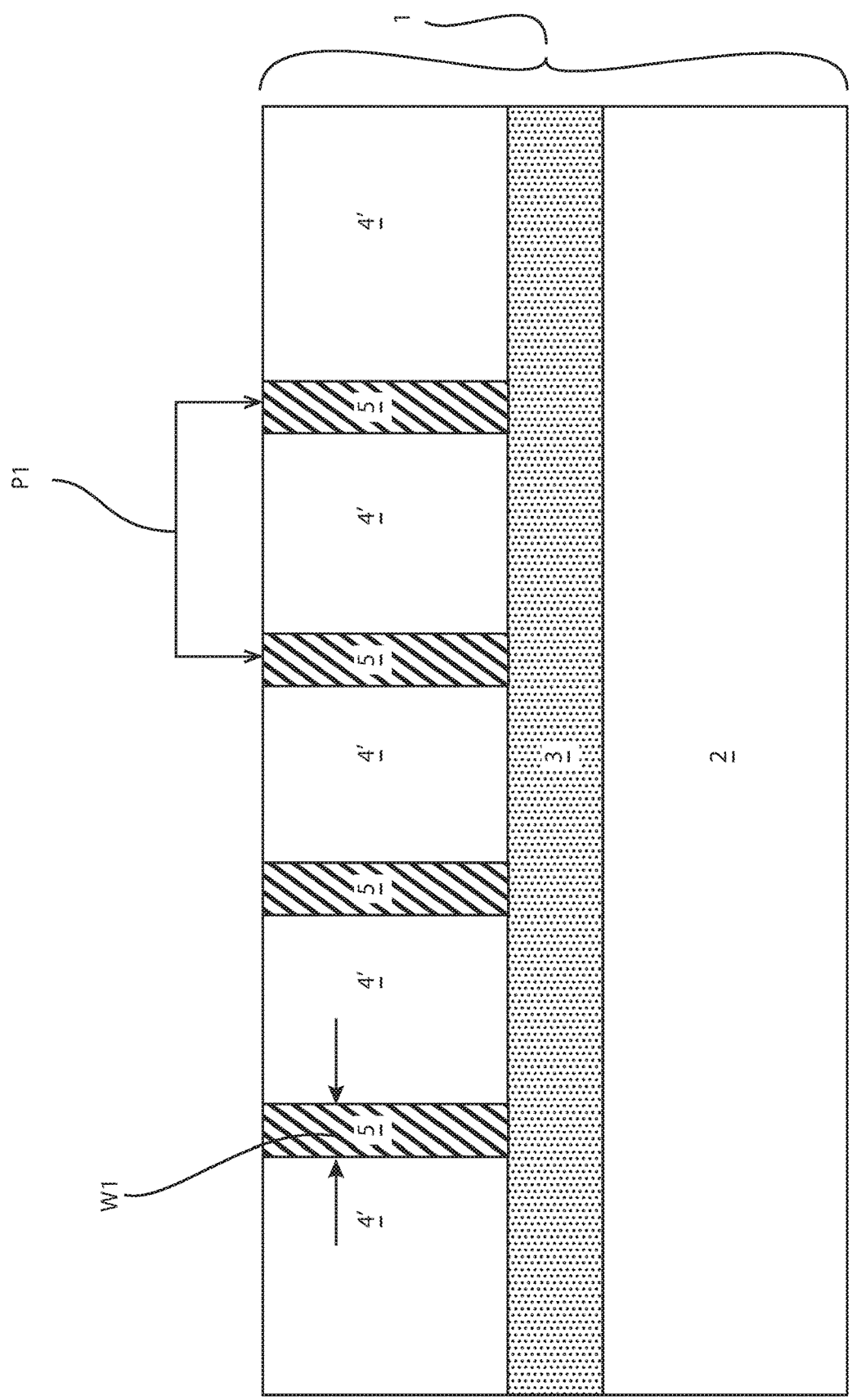
FIG. 3 is a side cross-sectional view depicting one embodiment of ion implanting a first conductivity type dopant into first regions of the semiconductor layer of the SOI substrate, wherein the first regions are separated by a first pitch.

FIG. 3 depicts one embodiment of ion implanting a first conductivity type dopant, e.g., n-type dopant, into first regions of the semiconductor layer 4, i.e., SOI layer 4, of the SOI substrate 1, wherein the first regions are separated by a first pitch P1. In the embodiment described herein, the first region of the semiconductor layer 4 are implanted with n-type dopants to provide the n-type conductivity doped region 5. Ion implantation is a materials engineering process by which ions of a material are accelerated in an electrical field and impacted into a solid. To provide that the ions that provide the n-type conductivity dopant region 5 are only implanted in the portions of the semiconductor layer 4 in which n-type conductivity doped region 5 is present, block masks may be formed.

More specifically, in one example, a first block mask (not shown) may be formed overlying the portion of the substrate 1 in which the n-type conductivity regions 5, the p-type conductivity region 6 and the intrinsic semiconductor layer 4' are to be positioned. The exposed portion of the substrate 1 that is not protected by the first block mask, is ion implanted with n-type dopant to provide n-type doped conductivity regions 4, while the remainder of the SOI layer 4 is protected by the first block mask. Thereafter, the first block mask is removed. The first pitch P1 that is separating adjacent n-type doped conductivity regions 5 may range from ~100 nm to ~500 nm.

Figure 4:
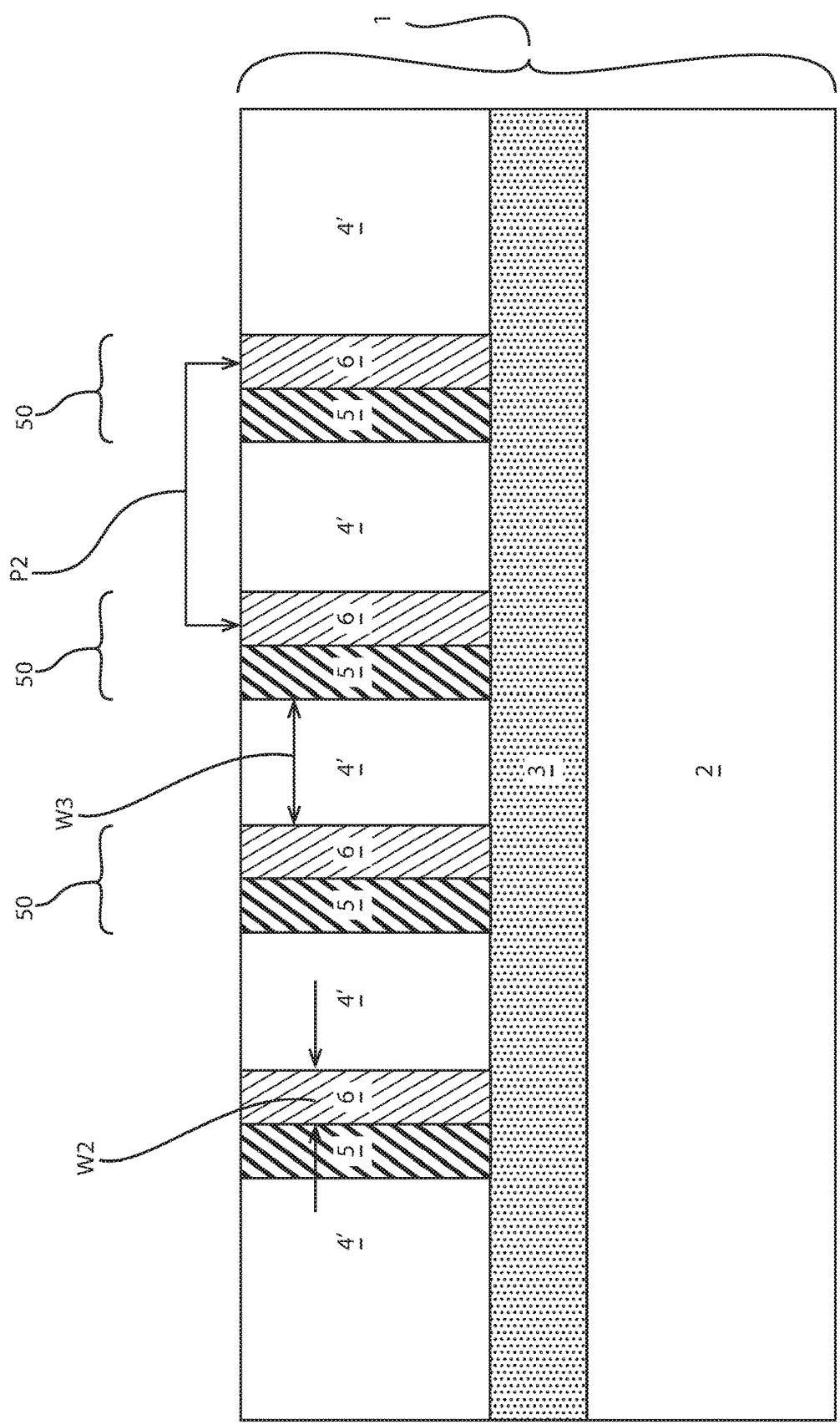
FIG. 4 is a side cross-sectional view depicting one embodiment of ion implanting a second conductivity type dopant into second regions of the semiconductor layer of the SOI substrate, wherein the second regions are separated by a second pitch.

FIG. 4 depicts one embodiment of ion implanting a second conductivity type dopant, e.g., p-type dopant, into second regions of the semiconductor layer 4 of the SOI substrate 1, wherein the second regions are separated by a second pitch P2. This implant step provides the p-type conductivity dopant regions 6 that are present in regions of the SOI layer 4 that are abutting the n-type conductivity doped regions 5 to provide p-n junctions 50. Similar to the formation of the n-type doped regions 5, the p-type conductivity doped regions 6 may be formed using ion implantation in combination with block masks. For example, a second block mask (not shown) may be formed overlying the portion of the substrate 1, in which the n-type conductivity doped regions 5, i.e., first conductivity type doped regions, are present. The portion of the semiconductor layer 4 that will not be doped to provide the intrinsic region separating the p-n junctions 50 will also be covered by the block mask. The exposed portion of the semiconductor layer 4 that is not covered by the second block mask is ion implanted to provide p-type doped conductivity type regions 6, while the n-type doped conductivity type regions 5 and the intrinsic semiconductor layer 4' are protected by the second block mask. The second P2 that is separating adjacent p-type doped conductivity regions 6 may range from ~100 nm to ~500 nm.

The block masks that provide the first and second block masks, may comprise soft and/or hardmask materials and can be formed using deposition, photolithography and etching.

In a following step, the semiconductor layer 4, i.e., SOI layer 4, including the n-type conductivity doped region 5, the p-type conductivity doped region 6 and the intrinsic semiconductor layer 4' is patterned to provide the dimensions of the photovoltaic device 100. The semiconductor layer 4 may be patterned using photolithography and etch processes. For example, a photoresist mask may be formed on the semiconductor layer by applying a photoresist layer, exposing the photoresist layer to a pattern of radiation, and then developing the pattern into the photoresist layer utilizing conventional resist developer. Typically, the block masks have a thickness ranging from 100 nm to 300 nm. The exposed portion of the semiconductor layer 4 may then be etched using an etch process, such as an anisotropic etch, e.g., reactive ion etch (RIE), or an isotropic etch, such as a wet chemical etch.

Thereafter, the contacts 7 may be formed to the n-type conductivity doped regions 5 and the p-type conductivity doped regions 6 using deposition, photolithography and etching processes. For example, a metal layer can be deposited using a physical vapor deposition (PVD) process. The PVD process may include plating, electroplating, electroless plating and combinations thereof. The final structure is depicted in FIG. 1.

Figure 5:
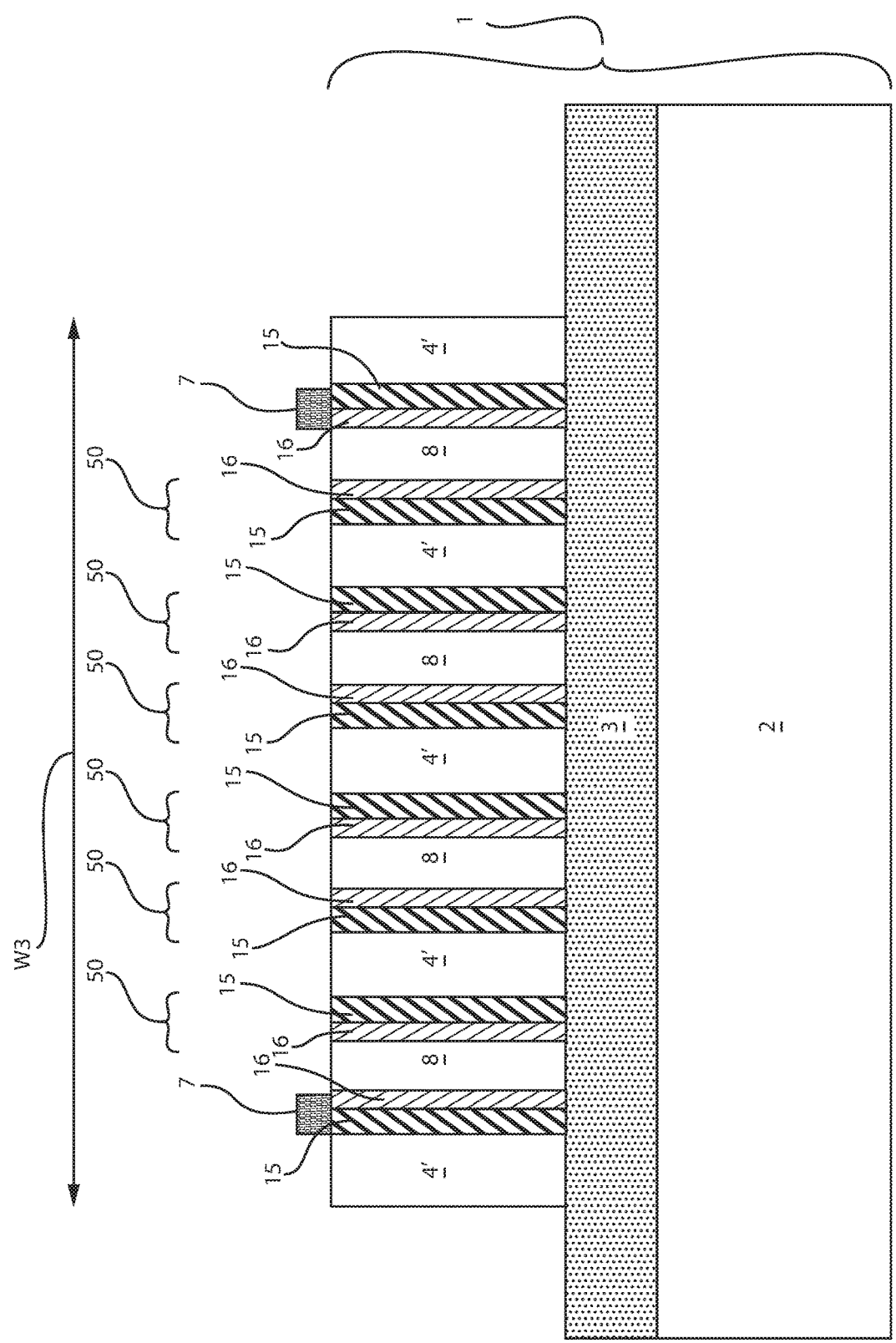
FIG. 5 is a side cross-sectional view depicting another embodiment of a type IV semiconductor based laterally stacked multi-junction photovoltaic cell, in which the p-n junctions are produced by epitaxially formed in situ doped semiconductor materials, in accordance with one embodiment of the present disclosure.
Figure 6:
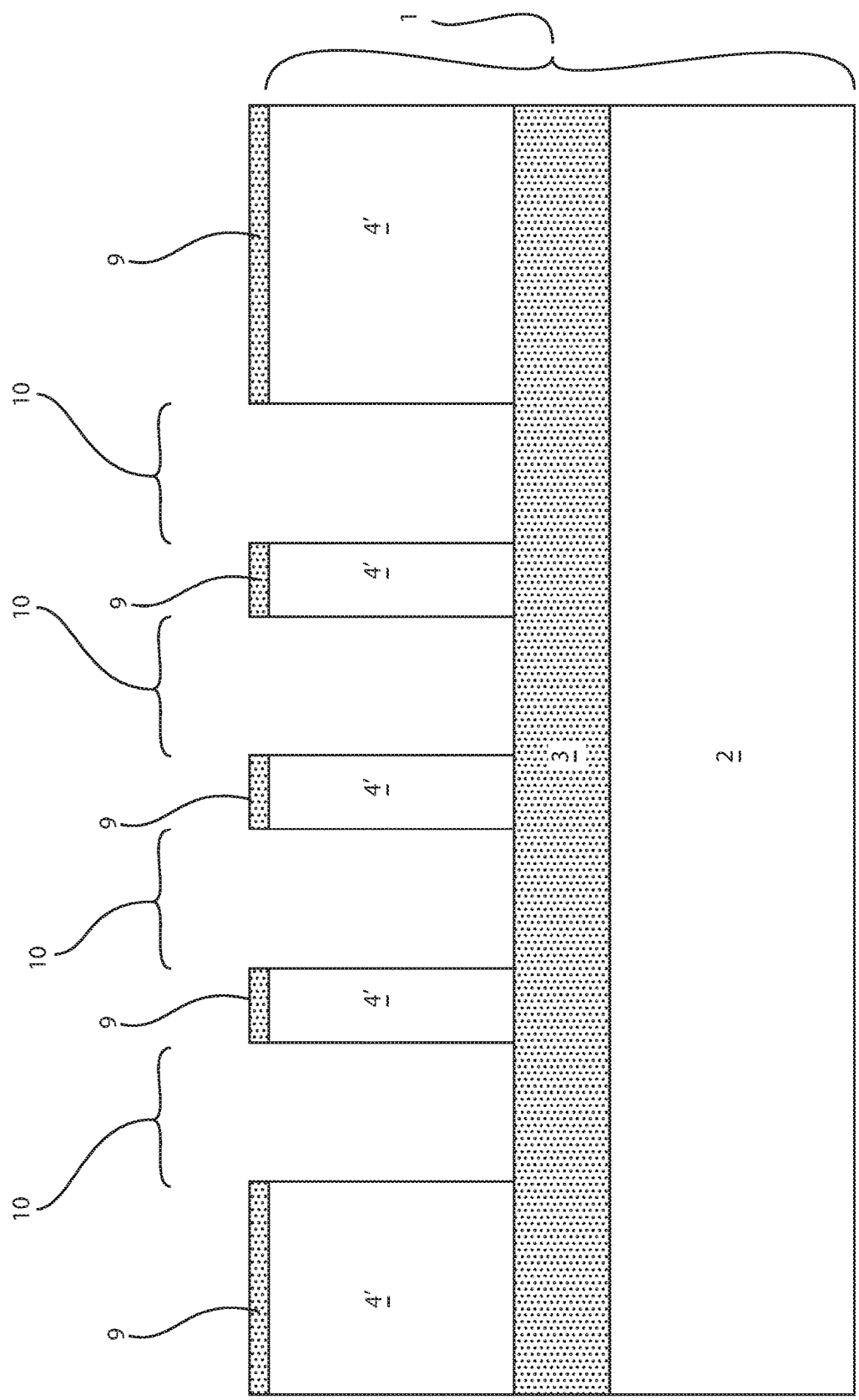
FIG. 6 is a side cross-sectional view depicting one embodiment of patterning the semiconductor layer of an SOI substrate to provide a plurality of openings to a buried dielectric layer.

FIG. 5 illustrates another embodiment of a photovoltaic device 200 of a type IV semiconductor based laterally stacked multi-junction photovoltaic cell, in which the p-n junctions 50 are produced from epitaxially formed in situ doped semiconductor materials 15, 16. The epitaxial formed in situ doped semiconductor materials 15 that provide the p-n junction of the device 200 depicted in FIG. 5 may each have the same width of their corresponding n-type conductivity dopant region 5 and p-type conductivity dopant region 6 that are formed using ion implantation in the device 100 depicted in FIG. 1. In some examples. the epitaxially formed in situ doped semiconductor materials 15 that are depicted in FIG. 5 may each have a slightly lesser width than the n-type conductivity dopant region 5 and p-type conductivity dopant region 6 that are depicted in FIG. 1. Because the photovoltaic device 200 that is depicted in FIG. 5 is similar to the photovoltaic device 100 that is depicted in FIG. 1, each of the structures depicted in FIG. 5 having a similar reference number in FIG. 1, may be described using the description of the structure having the same reference number for the photovoltaic device 100 depicted in FIG. 1.

The structure depicted in FIG. 5 may be formed using a method that includes etching a plurality of openings 10 through a semiconductor layer 4 of an SOI substrate 1 to a buried oxide layer 3 of the SOI substrate 2; forming a first conductivity type doped semiconductor material 15 on sidewalls of the semiconductor layer 4 exposed by the plurality of openings 10; forming a second conductivity type doped semiconductor material 16 on sidewalls of the first conductivity type doped semiconductor material 15 to provide p-n junctions 50; and forming intrinsic semiconductor material 8 filling a remainder of the plurality of openings 10. The adjacent p-n junctions 50 are separated by the intrinsic semiconductor material 8 to provide P-I-N cells that are horizontally oriented.

One embodiment of an SOI substrate 1 that is suitable for use with a method of forming a photovoltaic device 200 as depicted in FIG. 5 is provided above with reference to FIG. 2. The plurality of openings 10 that are formed through the semiconductor layer 4 of the SOI substrate 5 may be provided by anisotropic etch processes, such as reactive ion etch. The portions of the SOI substrate 1 that are etched to provide the openings 10 may include the use of masks, such as photoresist soft masks, or hard masks. In some embodiments, prior to forming the mask structure and etching, a dielectric layer 9 is formed atop the semiconductor layer 4. The dielectric layer 9 may be an oxide, nitride or oxynitride containing dielectric that can be deposited using chemical vapor deposition (CVD). For example, the dielectric layer 9 may be silicon nitride. The etch mask used for forming the openings 10 may then be formed on the upper surface of the dielectric layer 10.

The openings 10 may be formed in the dielectric layer 9 and the underlying semiconductor layer 4 using photolithography and etch method steps. For example, a pattern is produced by applying a photoresist to the surface to be etched; exposing the photoresist to a pattern of radiation; and then developing the pattern into the photoresist utilizing conventional resist developer. Once the patterning of the photoresist is completed, the sections of the dielectric layer covered by the photoresist are protected while the exposed regions are removed using a selective etching process that removes the unprotected regions.

The etch process for forming the opening 10 may be an anisotropic etch, such as reactive ion etch (RIE), laser etching, and/or plasma etching. In other embodiments, the etch process for forming the openings 10 may be an isotropic etch, such as a wet chemical etch. The openings typically extend through an entirety of the semiconductor layer 4 providing an exposed semiconductor sidewall within the openings 10. The etch process for forming the opening 10 typically exposes an upper surface of the buried dielectric layer 2. The etch process for forming opening 10 may be selective to the buried dielectric layer 2.

Figure 7:
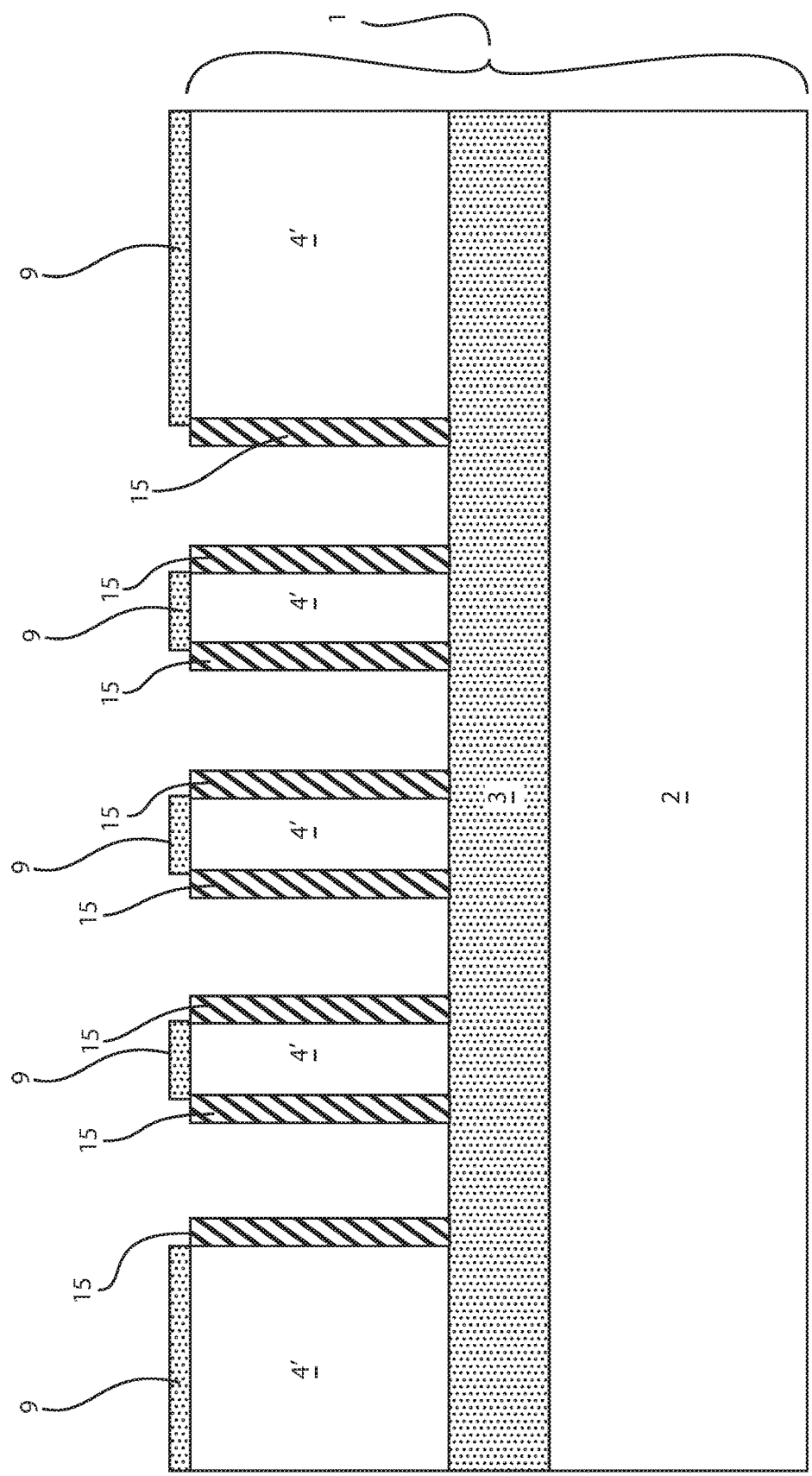
FIG. 7 is a side cross-sectional view depicting forming a first conductivity type doped semiconductor material on sidewalls of the semiconductor layer exposed by the plurality of openings, in accordance with one embodiment of the present disclosure.

FIG. 7 depicts forming a first conductivity type doped semiconductor material 15 on sidewalls of the semiconductor layer 4 exposed by the plurality of openings 10. In the embodiment described with reference to FIGS. 5-9, the first conductivity type doped semiconductor material 15 may be in situ doped and epitaxially formed. The first conductivity type doped semiconductor material 15 is hereafter referred to as a epitaxially formed in situ doped n-type semiconductor material 15. "Epitaxial growth and/or deposition" means the growth of a semiconductor material on a deposition surface of a semiconductor material, in which the semiconductor material being grown has substantially the same crystalline characteristics as the semiconductor material of the deposition surface. In some embodiments, when the chemical reactants are controlled and the system parameters set correctly, the depositing atoms arrive at the deposition surface with sufficient energy to move around on the surface and orient themselves to the crystal arrangement of the atoms of the deposition surface. Thus, an epitaxial film deposited on a {100} crystal surface will take on a {100} orientation.

The epitaxial growth process for forming the epitaxially formed in situ doped n-type semiconductor material 15 is selective to forming on semiconductor surfaces, and not forming on dielectric surfaces. Therefore, the epitaxially formed in situ doped n-type semiconductor material 15 will only form on the exposed sidewalls of the semiconductor layer 4, but will not form on the exposed surface of the buried oxide layer 3 and the dielectric layer 9. The epitaxially formed in situ doped n-type semiconductor material 15 will overlap a portion of the buried oxide layer 3 during lateral growth from the sidewall of the opening 10 provided by the etched surface of the semiconductor layer 4, but there is no epitaxial relationship between the epitaxially formed in situ doped n-type semiconductor material 15 and the buried oxide layer 3.

The epitaxially formed in situ doped n-type semiconductor material 15 is a type IV semiconductor containing material layer. For example, the epitaxially formed in situ doped n-type semiconductor material 15 may be composed of silicon (Si), germanium (Ge), silicon germanium (SiGe) and other semiconductor materials. The epitaxial deposition process may employ the deposition chamber of a chemical vapor deposition type apparatus, such as a PECVD apparatus. A number of different sources may be used for the epitaxial deposition of the in situ doped n-type semiconductor material 15. In some embodiments, the gas source for the deposition of an epitaxially formed in situ doped n-type semiconductor material 15 may include silicon (Si) deposited from silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. In other examples, when the in situ doped n-type semiconductor material 15 includes germanium, a germanium gas source may be selected from the group consisting of germane, digermane, halogermane, dichlorogermane, trichlorogermane, tetrachlorogermane and combinations thereof. The temperature for epitaxial silicon germanium deposition typically ranges from 450° C. to 900° C. Although higher temperature typically results in faster deposition, the faster deposition may result in crystal defects and film cracking.

The in situ doped n-type semiconductor material 15 may be in situ doped with an n-type dopant. By "in-situ" it is meant that the dopant that dictates the conductivity type of the in situ doped n-type semiconductor material 15 is introduced during the process step, e.g., epitaxial deposition, that forms the in situ doped n-type semiconductor material 15. The n-type gas dopant source may include arsine ($AsH_3$), phosphine ($PH_3$) and alkylphosphines, such as with the empirical formula $R_xPH_{(3-x)}$, where R=methyl, ethyl, propyl or butyl and x=1, 2 or 3. Alkylphosphines include trimethylphosphine (($CH_3$)3P), dimethylphosphine (($CH_3$)$_2$PH), triethylphosphine (($CH_3CH_2$)$_3$P), diethylphosphine (($CH_3CH_2$)$_2$PH) and combinations thereof. The dopant concentrations for the in situ doped n-type semiconductor material 15 may be similar to the dopant concentrations for the above described n-type conductivity dopant region 5 that is depicted in FIG. 1.

Figure 8:
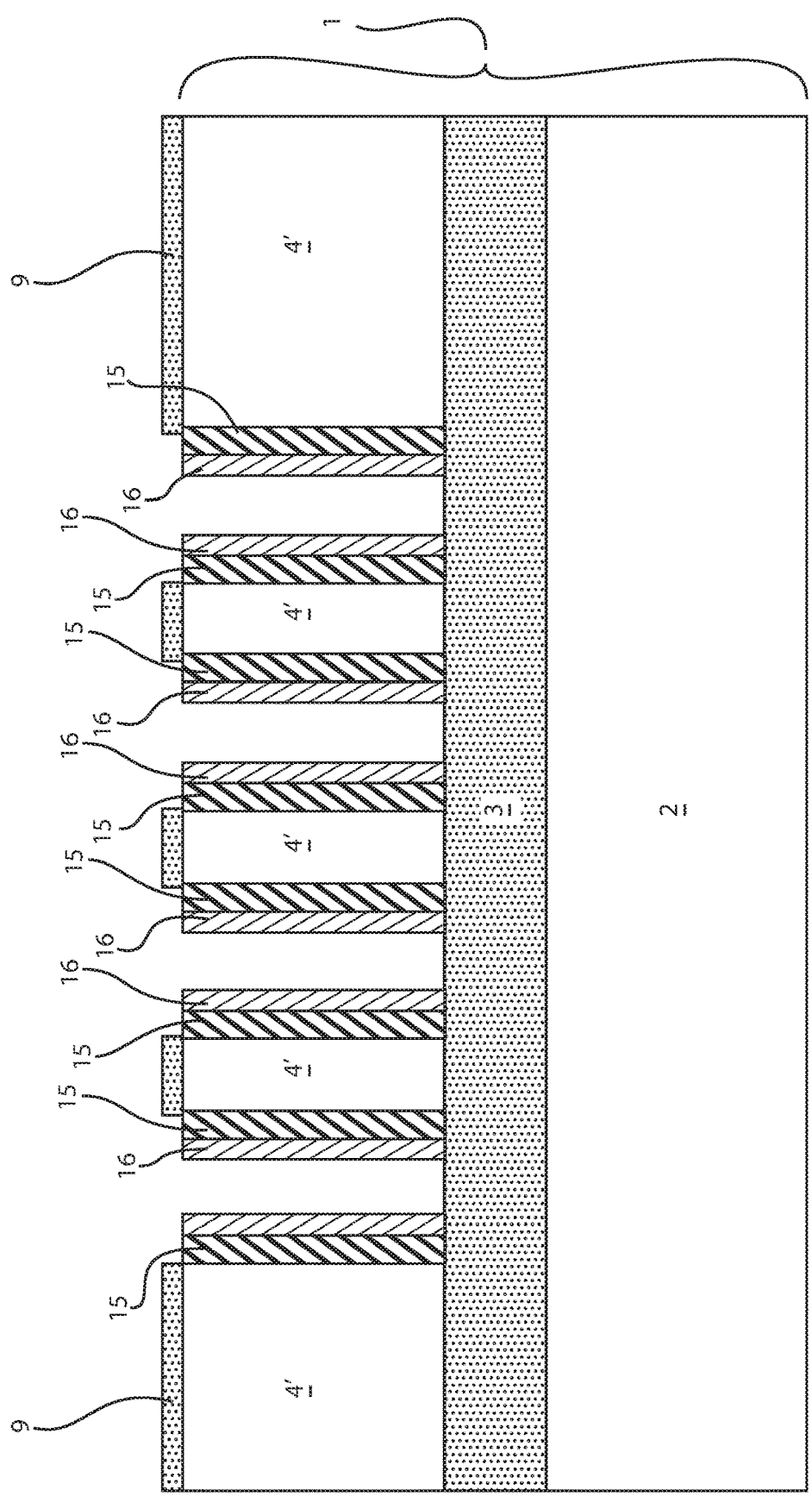
FIG. 8 is a side cross-sectional view depicting forming a second conductivity type doped semiconductor material on sidewalls of the first conductivity type doped semiconductor material to provide p-n junctions.

FIG. 8 depicts forming a second conductivity type doped semiconductor material 16 on sidewalls of the first conductivity type doped semiconductor material 15 to provide p-n junctions 50. The second conductivity type doped semiconductor material 16 is hereafter referred to as in situ doped p-type semiconductor material 16. Similar to the in situ doped n-type semiconductor material 15, the in situ doped p-type semiconductor material 16 is epitaxially formed using a selective deposition process, in which the epitaxial semiconductor material is only formed on semiconductor surfaces, such as the sidewalls of the in situ doped n-type semiconductor material, and is not formed on dielectric surfaces, such as the buried dielectric layer 3 and the dielectric layer 9. The above described epitaxial process conditions for forming the in situ doped n-type semiconductor material 15 is equally applicable to forming the in situ doped p-type semiconductor material 16 with the exception of the in situ dopant. A p-type dopant, such as borane and diborane gas, may be employed to in situ dope the in situ doped p-type semiconductor material 16.

Figure 9:
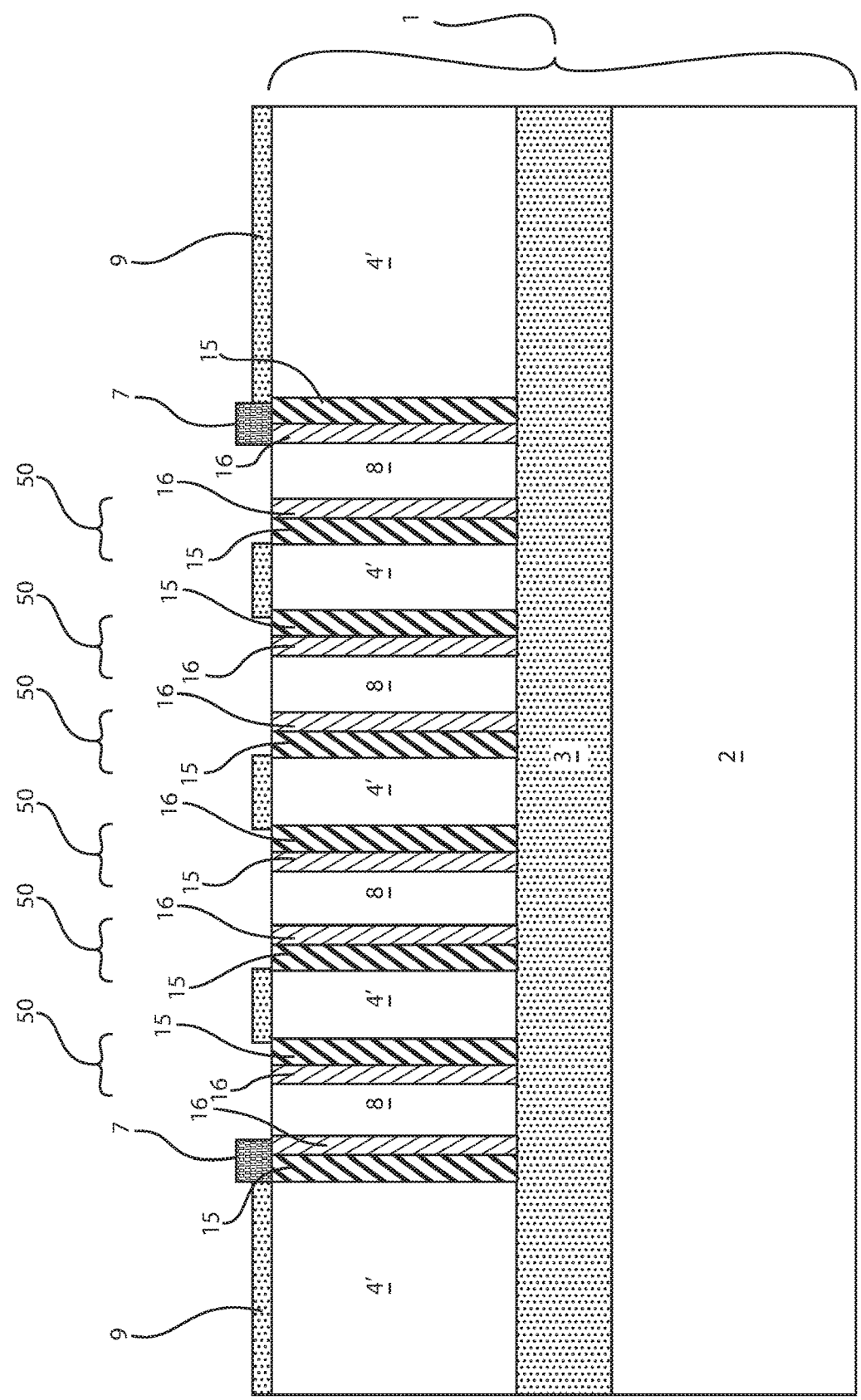
FIG. 9 is a side cross-sectional view depicting forming intrinsic semiconductor material filling a remainder of the plurality of openings, wherein the adjacent p-n junctions are separated by the intrinsic semiconductor material to provide P-I-N cells that are horizontally oriented.

FIG. 9 depicts forming intrinsic semiconductor material 8 filling a remainder of the plurality of openings 10, wherein the adjacent p-n junctions are separated by the intrinsic semiconductor material 8 to provide P-I-N cells that are horizontally oriented. The intrinsic semiconductor material 8 may be composed of a type IV semiconductor, such as silicon and germanium. The intrinsic semiconductor material 8 may be epitaxially formed. The epitaxial deposition processes described for the in situ doped n-type semiconductor material 15 and the in situ doped p-type semiconductor material 16 are suitable for describing forming the intrinsic semiconductor material 8 with the exception that the epitaxial deposition process for forming the intrinsic semiconductor material 8 does not include an in situ doping gas to dope the intrinsic semiconductor material layer 8 with n-type or p-type dopants.

The intrinsic semiconductor material 8 separates the in situ doped n-type semiconductor material 15 and the in situ doped p-type semiconductor material 16 from contacting each other outside of the junctions 50. It is also noted that a remaining portion of the semiconductor layer 4' also provides intrinsic semiconductor material that is positioned between at least some junctions 50.

Referring to FIG. 5, in a following process step, the semiconductor layer 4 including the in situ doped n-type semiconductor material 15, the in situ doped p-type semiconductor material 16 and intrinsic semiconductor material 8, 4' are patterned and etched to dictate the geometry of the photovoltaic device 200. The pattern and etch steps have been described above for controlling the dimensions of the photovoltaic device 100 described with reference to FIGS. 1-4. Metal contacts 7 are also formed to the p-n junctions 50.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Having described preferred embodiments of a system and method (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A photovoltaic device comprising:
a semiconductor on insulator (SOI) substrate;
n-type doped regions extending from an upper surface of the semiconductor layer of the SOI substrate to a buried oxide layer of the SOI substrate in a first plurality of regions in the SOI substrate;
p-type doped regions extending from the upper surface of the semiconductor layer of the SOI layer to a buried oxide layer on the SOI substrate in a second plurality of regions in the SOI substrate, where one of each of the first and second plurality are adjacent to one another to provide a plurality of P-N junctions; and
intrinsic semiconductor between the first and second plurality of regions in the SOI substrate separating adjacent P-N junctions to provide P-I-N cells that are horizontally oriented, wherein the n-type doped regions are paired in direct contact with the p-type doped regions to provide the plurality of p-n junctions.

2. The photovoltaic device of claim 1, wherein the semiconductor layer of the SOI substrate is a type IV semiconductor substrate.

3. The photovoltaic device of claim 2, wherein the type IV semiconductor substrate includes a silicon as a type IV semiconductor atop the buried oxide layer of silicon oxide.

4. The photovoltaic device of claim 1, wherein the intrinsic semiconductor is a region of the semiconductor layer.

5. The photovoltaic device of claim 4, wherein the intrinsic semiconductor is not doped with a p-type or n-type dopant.

6. The photovoltaic device of claim 1, wherein the intrinsic semiconductor is a region of epitaxially formed intrinsic semiconductor material.

7. The photovoltaic device of claim 1, wherein the P-I-N cells that are horizontally oriented having length dimension ranging from 10 microns to 500 microns.

8. The photovoltaic device of claim 7, wherein the P-I-N cells have a width dimension ranging from 10 microns to 500 microns.

9. The photovoltaic device of claim 1, further comprising a cathode electrode connected to one of the n-type doped regions or the p-type doped regions.

10. The photovoltaic device of claim 9, further comprising an anode electrode connected to an other of the n-type doped regions or the p-type doped regions that the cathode electrode is not connected to.

11. A photovoltaic device comprising:
a substrate structure including a semiconductor layer atop a dielectric layer;
n-type doped regions extending from an upper surface of the semiconductor layer to the dielectric layer in a first plurality of regions in the substrate structure;
p-type doped regions extending from the upper surface of the semiconductor layer to the dielectric layer on the substrate in a second plurality of regions in the SOI substrate structure, where one of each of the first and second plurality are adjacent to one another to provide a plurality of P-N junctions; and
intrinsic semiconductor between the first and second plurality of regions in the substrate structure separating adjacent P-N junctions to provide P-I-N cells that are horizontally oriented wherein the n-type doped regions are paired in direct contact with the p-type doped regions to provide the plurality of p-n junctions.

12. The photovoltaic device of claim 11, wherein the semiconductor layer is a type IV semiconductor.

13. The photovoltaic device of claim 12, wherein the dielectric layer is silicon oxide.

14. The photovoltaic device of claim 11, wherein the intrinsic semiconductor is a region of the semiconductor layer.

15. The photovoltaic device of claim 14, wherein the intrinsic semiconductor is not doped with a p-type or n-type dopant.

16. The photovoltaic device of claim 11, wherein the intrinsic semiconductor is a region of epitaxially formed intrinsic semiconductor material.

17. The photovoltaic device of claim 11, wherein the P-I-N cells that are horizontally oriented having length dimension ranging from 10 microns to 500 microns.

18. The photovoltaic device of claim 17, wherein the P-I-N cells have a width dimension ranging from 10 microns to 500 microns.

19. The photovoltaic device of claim 11, further comprising a cathode electrode connected to one of the n-type doped regions or the p-type doped regions.

20. The photovoltaic device of claim 19, further comprising an anode electrode connected to another of the n-type doped regions or the p-type doped regions that the cathode electrode is not connected to.

* * * * *